United States Patent [19]
Palmer

[11] 3,936,763
[45] Feb. 3, 1976

[54] NULL INPUT OMEGA TRACKING FILTER SYSTEM

[75] Inventor: Winslow Palmer, Fort Myers, Fla.

[73] Assignee: The United States of America as represented by the Secretary of the Navy, Washington, D.C.

[22] Filed: Nov. 15, 1974

[21] Appl. No.: 524,025

[52] U.S. Cl.............. 329/104; 343/105 R; 325/346
[51] Int. Cl.²........................................... H03D 3/24
[58] Field of Search ..... 328/134; 307/232; 329/104, 329/122; 343/105 R; 325/346

[56] References Cited
UNITED STATES PATENTS

| | | | |
|---|---|---|---|
| 3,099,796 | 7/1963 | Zadoff | 329/122 X |
| 3,761,829 | 9/1973 | Spaulding | 329/104 |
| 3,769,602 | 10/1973 | Griswold | 329/122 |
| 3,866,133 | 2/1975 | Debloois et al. | 329/104 |

Primary Examiner—John S. Heyman
Attorney, Agent, or Firm—R. S. Sciascia; G. J. Rubens; T. M. Phillips

[57] ABSTRACT

Tracking filter apparatus for determining the relative phase of synchronized CW navigation systems. The apparatus generates a square wave signal the phase and amplitude of whose fundamental sinusoidal components match those of the fundamental components of signals being tracked. The apparatus operates with a digital computer which processes sample OMEGA amplitudes to acquire and maintain synchronism with the standard OMEGA multiplex pattern.

6 Claims, 6 Drawing Figures

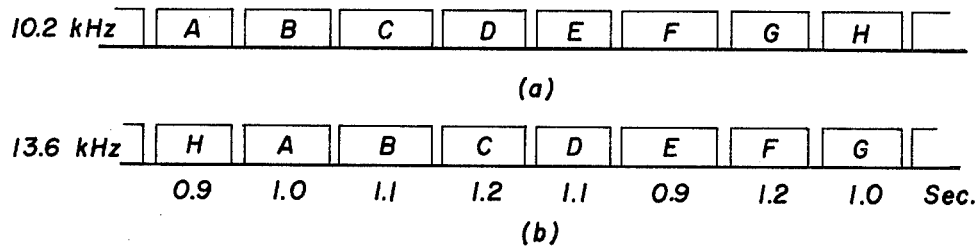
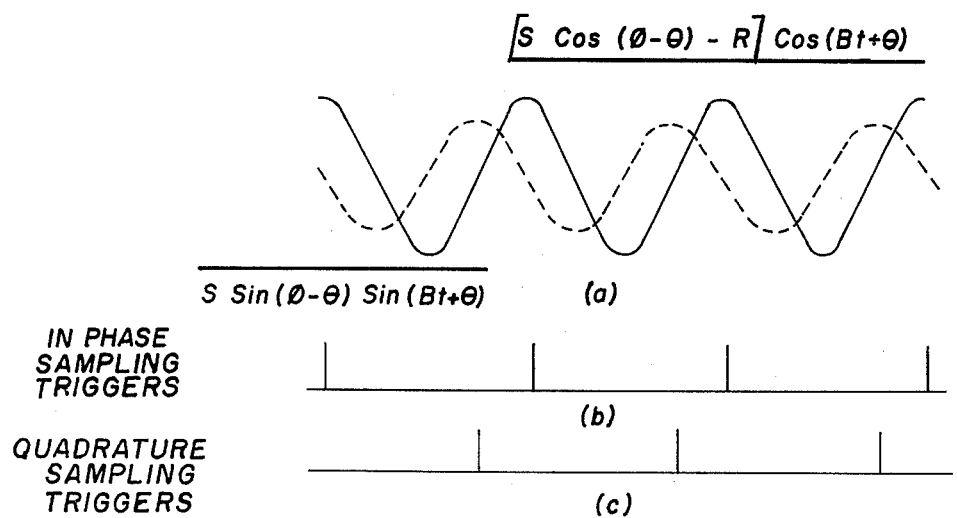
FIG. 2
FIG. 3

3,936,763

NULL INPUT OMEGA TRACKING FILTER SYSTEM

BACKGROUND OF THE INVENTION

In CW navigation systems such as OMEGA, DECCA, and LORAC receivers determine relative RF-phase of synchronized radio signals by amplifying the signals separately with either time or frequency multiplex techniques. The signals are amplified to a level at which the relative phase can be conveniently observed. Any difference in the timing of the processing of the signals comprises an error in the relative phase indication, thereby requiring that extreme measures be taken in the design of signal amplifiers to ensure that all signals suffer at least the same amplifier delays regardless of differences in amplitude, wave shape, noise level, etc. In precision type systems such as Differential OMEGA, ultimate accuracy can be limited more by the residual uncontrollable phase uncertainty in the receivers than by random propagation effects, particularly at short ranges.

In the prior art apparatus, variation in receiver delays between signals is eliminated from the phase indication by a technique involving cancellation of the received signals at the antenna terminals. A locally generated signal is injected into the antenna circuit and adjusted in phase and amplitude such that the phasor difference, as amplified to an observable level in a sensitive radio receiver goes to a null.

SUMMARY OF THE INVENTION

Phase tracking apparatus for use with OMEGA and other CW navigation systems are disclosed. The apparatus tracks RF-phase of the fundamental components of signals being tracked in conjunction with a digital computer which is programmed to process sample amplitudes of OMEGA signals so as to acquire and maintain synchronism with the OMEGA multiplex pattern. The apparatus tracks signal phase at two discrete frequencies and embodies a Null Input Tracking Filter and frequency conversion through a narrow-band IF-amplification.

BRIEF DESCRIPTION OF THE DRAWINGS

FIGS. 2($a$) and 2($b$) represent graphical illustrations of the OMEGA multiplex patterns used with the system of FIG. 1; and FIGS. 3($a$) through 3($c$) represent graphically the IF output sampling achieved with the system of FIG. 1.

DESCRIPTION OF THE PREFERRED EMBODIMENT

Figure 1:
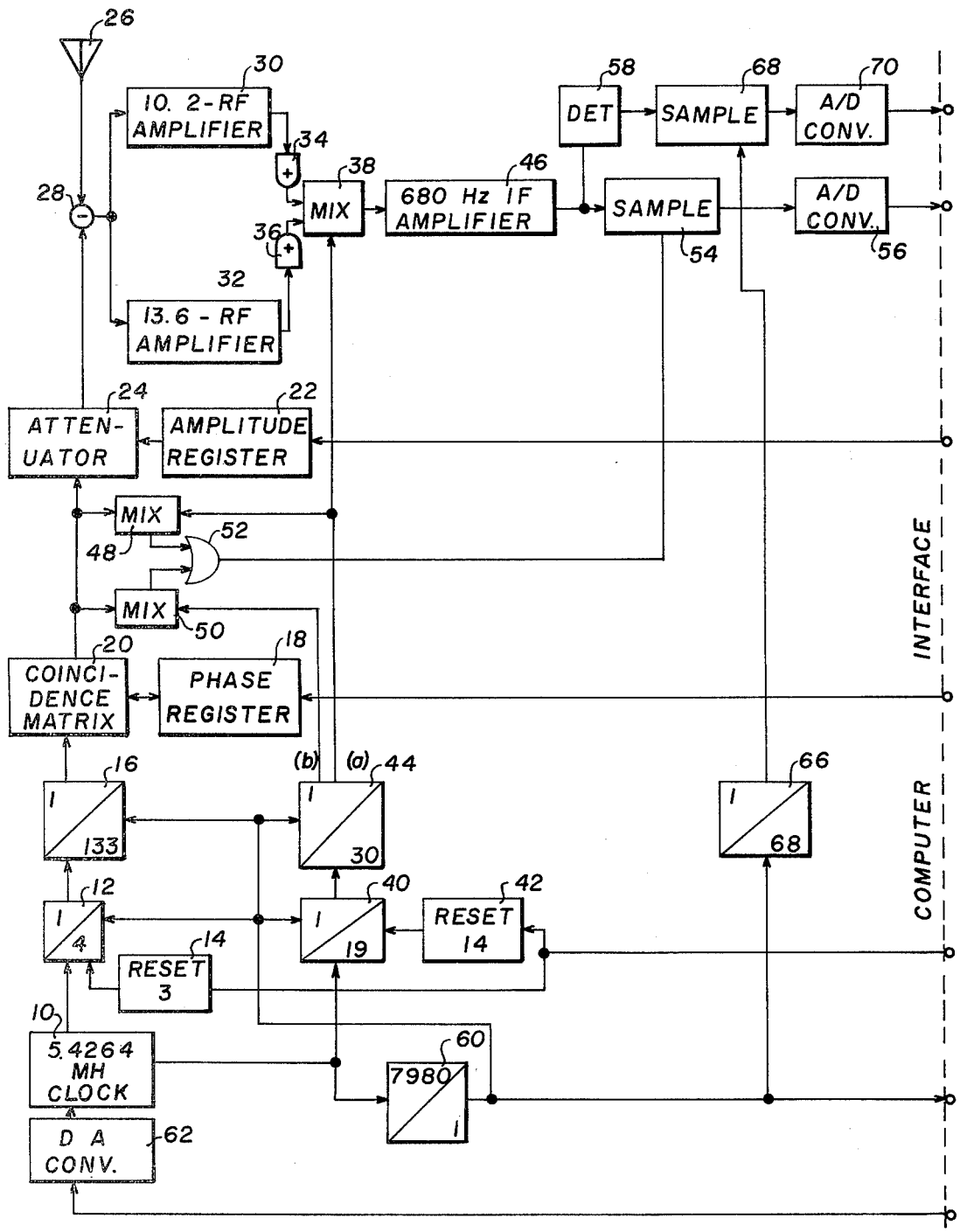
FIG. 1 is a block diagram of the OMEGA null input signal processor embodying the inventive concept to be disclosed herein.

The OMEGA signal processor of FIG. 1 comprises a computer "front end" system adapted to develop computer input data for tracking OMEGA signal phase at two frequencies (e.g., 10.2-kHz and 13.6-kHz). The system employs a null input tracking filter process and frequency conversion through a narrow band 680-Hz IF-amplification to be described hereinafter.

The processor is intended to operate in conjunction with a computer (not shown) which is programmed to process sample amplitudes of OMEGA signals to acquire and maintain synchronism with the OMEGA multiplex pattern of FIGS. 2($a$) and 2($b$). The computer also tracks the RF-phase of the various signal components being received.

To accomplish the above, it is assumed that the computer either operates in synchronism with the OMEGA processor of FIG. 1 under the control of a frequency standard, or asynchronously on command from the OMEGA processor so that the program iterates over an exact one or more 10-second OMEGA sequence periods.

In FIG. 1, the oscillator 10 represents a clock pulse generator with an operating frequency of 5.4264-mHz which is a common multiple of 10.2-kHz; (10.2 − 0.68)-kHz; 13.6-kHz; and, (13.6 − 0.68)-kHz.

The frequency divider 12 comprises a 4 : 1 counter which is operatively connected to a reset controller 14. When activated the controller 14 causes the counter 12 to reset at the count of three instead of four so that its counting ratio thus becomes 3 : 1. The counter 16 also comprises a frequency divider with a counting ratio of 133 : 1.

When counter 12 counts at 4 : 1, the overall countdown is thus: 4 × 133 = 532 : 1, thereby causing the counter 16 to cycle at a frequency of $$\frac{5.4264 \times 10^6}{532} = 10,200 - \text{Hz}.$$

When counter 12 is counting at 3 : 1, the overall countdown is 3 × 133 = 399 : 1, thereby producing a cycling frequency of $$\frac{5.4264 \times 10^6}{399} = 13,600 - \text{Hz}.$$

The digital register 18 is adapted to receive and store any number from 0 to 132 and has a read-in capability wherein a new number replaces the number previously held.

The coincidence matrix 20 comprises logic circuitry adapted to switch the output to "+1" and hold the output when the count reached in the counter 16 passes through the count standing in register 18. The matrix 20 further switches the output state to a "−1" when the count reached in the counter 16 passes through the count in register 18 by ± 66 counts. The above action produces a square-wave whose period is the same as the cycling period of the counter 16, but whose phase, relative to the cycling of the counter 16, depends upon the count standing in the register 18.

Digital register 22 is adapted to receive and store any number from 0 to 255 with read-in of a new number replacing the number held. The attenuator 24 is a switchable device which is controlled by the register 22 to provide attenuation from 0 to 126-DB, depending upon the quantity standing in the register 22.

The receiving antenna 26 receives remote signals whose phase is to be determined. A linear signal combining element 28, e.g., a hybrid transformer, or a dual input operational amplifier or similar linear combining element, forms the algebraic or phasor difference between the signals received by the antenna 26 and the local signal passing the attenuator 24. The difference circuit 28 is not a phase detector, nor is it a mixer or other non-linear operator. Its output is the simple phasor difference of its inputs, without frequency change, phase detection, or any other non-linear operation.

The bandpass amplifier 300 is tuned to 10.2-kHz with linear-logarithmic amplitude response and progressively narrowing passband to provide maximum discrimination against impulsive noises. The amplifier 32 is a similar type of device but is tuned to 13.6-kHz.

The switches 34 and 36 comprise "AND" gates which are actuated by control signals from the computer to thereby connect either amplifier 30 or 32 to the mixer 38.

The counter or frequency divider 40 subdivides the clock pulse frequency by 19 : 1. Associated with the counter 40 is a reset control 42 which when activated causes the counter 40 to reset at the count of fourteen instead of nineteen, thereby dividing the clock frequency by 14 : 1. The counter or frequency divider 44 subdivides the output of the counter 40 by a further ratio of 30 : 1, and its output on line (a) changes to +1 at the count of 30 and reset, and to −1 at the count of 15. The output on line (b) changes to +1 at the count of 7 and to −1 at the count of 32. Thus, the outputs of the counter 44 comprise two square-waves, with the wave on line (b) lagging the wave on line (a) by a quarter period of phase.

When the counter 40 is operating with a count of 19, the overall countdown is 19 × 30 = 570 : 1, thereby producing a cycling frequency of:

$$\frac{5.4264 \times 10^6}{570} - Hz = 9520 - Hz = (10,200 - 680) - Hz.$$

When the reset control 42 is activated so that the counter 40 resets on the count of 14, the overall countdown is equal to 14 × 30 = 420. This produces a cycling frequency of:

$$\frac{5.4264 \times 10^6}{420} - Hz = 12,920 - Hz = (13,600 - 680) - Hz.$$

The mixer or frequency converter 38 generates the heterodyne or difference frequency between the output of the counter 44 and the output of either amplifier 30 or 32. In either case it produces an intermediate frequency signal of 680-Hz.

The intermediate frequency amplifier 46 is a 680-Hz device with a linear-logarithmic, amplitude response characteristic.

The mixer 48 comprises a frequency converter and pulse generator which produces a series of sharp trigger pulses. The repetition frequency of the pulses is the difference between the frequency of the local signal from the coincidence matrix 20 and the local "in-phase signal" on line (a) from the divider 44, and its phase varies as the phase of the signal from the coincidence matrix 20.

The mixer 50 is similar to 48 and produces a second series of sharp trigger pulses at the same intermediate frequency and in-phase quadrature with respect to the pulses from the mixer 48.

The two IF pulse trains are combined in the "OR" element 52 to activate the sample and hold unit 54 which samples the output of the IF amplifier 46, while holding the sampled values between triggers. The analog to digital converter 56 converts the sampled amplitudes into digital quantities.

The amplitude detector 58 rectifies the signals from the IF amplifier 46 to produce an envelope waveform function of the incoming signals.

The counter or frequency divider 60 subdivides the clock frequency of 5.4264-mHz by 7980 to produce reference pulses at frequency of 680-Hz. These pulses are applied to reset the counters 12, 16, or 44 and 40 to cause the counter outputs to cycle at all times at the same relative phase with respect to the output of the counter 60.

The digital to analog converter 62 varies the frequency of the clock pulses over a very small range in accordance with frequency correcting code words transmitted to the A/D converter. Another counter or frequency divider 66 divides the 680-Hz output of counter 60 by 68 to produce a sequence of trigger pulses at 0.1 second intervals (10-Hz).

The sample and hold circuit 68 samples the output of the amplitude detector 58 every tenth second. The analog to digital converter 70 provides a digital representation of the envelope samples.

Alignment of the switching function of the computer program to match the sequence of OMEGA signal transmissions as shown in FIGS. 2(a) and 2(b) is obtained as follows. Either manually, or automatically, the computer program is changed to a "multiplex alignment mode," wherein correlation of the switching function with the incoming signal sequence is checked and corrected as required. In the multiplex alignment mode, a special data word is transmitted to the amplitude register 22, to provide infinite attenuation of the local signal so that only distant signals will pass to the signal amplifiers.

The gate 34, for example, would be set to pass any 10.2kHz signals to the mixer 38. The counter 40 would be set to count by 19 : 1 to produce an L.O. signal of 9.52-kHz. The L.O. signal sets the receiver to pass the 10.2-kHz signals to the amplitude detector 58, and produces the logarithmic amplitude envelope function at the input of the sampler 68. Alternatively the system could be set to pass 13.6-kHz signals if desired.

At 0.1 second intervals, timing pulses from the counter 66 cause sampler 68 to sample the envelope function. The sampled amplitudes are then converted to digital quantities by the A/D converter 70. The successive samples of the incoming signal envelopes are added or subtracted at each of one-hundred addresses in the computer memory. The address distribution is arranged to develop concurrently the coefficients of correlation for the one-hundred possible phase alignments or displacements between the computer program cycle and the incoming signal sequence.

The timing of the program cycle is adjusted to match the correlation function for which the coefficient of correlation with the incoming signal envelopes is a maximum. When correct alignment has been confirmed, the computer program is switched to the phase track mode.

RF-phase tracking is achieved as follows. Included in the computer programming is a specification of the time segments of the particular signal components, including assignment of certain addresses in the computer memory to hold quantities representing the phase and amplitude of each signal component to be tracked.

When, for example, the 10.2-kHz component from station A which is transmitted in segment A of the signal sequence of FIG. 2(a) is to be tracked, during the gap preceeding the start of the A segment of the sequence, the computer program directs that the word in the memory assigned to represent the phase of the 10.2-kHz component from station A be set up in the phase register 18, and that the word representing its amplitude be set up in the amplitude register 22. The computer program also directs that the reset units 14 and 42 be disabled, so that the counter 12 operates at 4 : 1 and the counter 40, at 19 : 1. Divider 16 then cycles at the rate of 10.2-kHz, and counter 44, at the rate of 9.52-kHz.

The output of the coincidence matrix 20 goes positive each time the counter 16 passes through the count stored in the register 40, and goes negative a half period later, producing a square-wave with a period of 10.2-kHz, and whose phase relative to the cycling of the counter 16 is determined by the count stored in the register 18. This square-wave of standardized amplitude is attenuated by a factor determined by the count stored in the register 22, and is applied along with the incoming signal to the input of the 10.2-kHz amplifier 30, through the subtraction unit 28.

The narrow bandwidth of the RF amplifier 30 passes only the fundamental sinusoidal component of the local square-wave, providing an input to the mixer 38 of the form:

$$S \cos(15\beta t + \phi) - R \cos(15\beta t + \theta),$$

where $\beta$ is the radian equivalent of 680-Hz, $$\beta = 2\pi 680 \text{ radians/second}.$$

The output of the mixer 38 is the low-frequency part of the product of the input signal and the "local oscillator" signal (L.O.) on line (a) from the counter 44, and has a form as follows:

$$L.O. = \cos 14\beta t,$$

so that the IF signal as shown in FIG. 3(a) is equal to the low-frequency portion of the following:

$$[S \cos(15\beta t + \phi) - R \cos(15\beta t + \theta)] \cos 14\beta t = [S \cos(\beta t + \phi) - R]\cos(\beta t + \theta) - S \sin(\phi - \theta)\sin(\beta t + \theta).$$

The output of the counter 44 on line (a) is mixed with the local reference from the coincidence matrix 20, to produce a difference signal equal to the low-frequency part of $[\cos(15\beta t + \theta)\cos 14\beta t] = \cos(\beta t + \theta)$. The output is converted into trigger pulses occuring at:

$$\beta t + \theta = 2N\pi, \text{ as in FIG. 3}(b).$$

Similarly, the quadrature output from the counter 40 on line (b) is mixed with the local signal from matrix 20 to produce a second difference signal equal to the low-frequency part of $[\cos(15\beta t + \theta)\sin 14\beta t] - \sin(\beta t + \theta)$. The output is likewise converted (by means not shown) into trigger pulses occurring at:

$$\beta t + \theta = (2N - \tfrac{1}{2})\pi,$$

as shown in FIG. 3(c).

The sampling pulses, which are derived by heterodyning the L.O. signals with the local reference, shift phase along with the local reference from the matrix 20. Thus, the in-phase triggers always coincide with the maxima of the "in-phase" component of the I.F. amplifier 32 output and also with the zeros of the "quadrature" component. Conversely, the quadrature sampling pulses of FIG. 3(c) always coincide with the maxima of the "quadrature" component, and with the zeros of the "in-phase" component, independently of the local phase angle, $\theta$.

As a minimum, the computer program is arranged so that successive quadrature samples are added algebraicly to the count of the register 18, thereby closing the phase control loop as a Type-I or rate lag control. Similarly, the successive, in-phase samples are summed in the amplitude register 22, thereby closing the amplitude control loop. Type-II or Type-III control functions can be provided by suitable processing of present and past data in the computer program before transmission to the phase and amplitude control registers.

The amplitude of the quadrature component is proportional to the sine of the phase difference between the local reference and the incoming signal. Thus, subtracting the sum of the samples from the total in the phase 18 generates a control function of the form:

$$\theta_{n+1} = \theta_n + K \sin(\phi - \theta_n)$$

which with proper attention to conditions for stability, etc., necessarily subsides to the following equation:

$$\theta \approx \phi$$

Similarly, the amplitude of the in-phase component is proportional to the difference of the amplitudes of the incoming and the local signals. Thus, subtracting the sum of the in-phase samples from the total in the amplitude register 32 generates a control function of the form:

$$\log R_{n+1} = \log R_n + K[S \cos(\phi - \theta_n) - R_n]$$

As above, with due consideration of conditions for stability, etc., also subsides to the following form:

$$R = S \cos(\phi - \theta) \approx S$$

To track the 13.6-kHz component of FIG. 2(b) which is transmitted by station A, the computer is programmed as follows. During the 0.2 second gap between the A and B segments, the accumulated data words in the registers 22 and 16 are transmitted to the assigned memory locations for the A data (10.2-kHz) to be replaced with stored data derived from previous A transmissions (13.6-kHz). The program also activates the reset units 14 and 42 whereby the counter 12 resets on the count of three. The counter 16 cycles at the rate of 13.6-kHz, and the counter 40 resets at the count of 14 so that the counter 44 cycles at the rate of 12.92-kHz. The program also enables gate 36 and closes the gate 34, so that the incoming 13.6-kHz signals are passed to the mixer 38.

During the B segment of the signal sequence, the system tracks the 13.6-kHz signals in the same manner as the above tracking of the 10.2-kHz signals of the A segment, and phase tracking of other signal components is accomplished in a like manner.

Data readout is achieved as follows. After initial transients have reached a steady state, the data words in the memory of the computer, and at the addresses assigned to hold the phase and amplitude data of the various signal components, will have converged to values which, when set up in the phase register 18, cause the fundamental component of the local square-wave to match with great precision the phase of the corresponding incoming signal component. Thus, the count standing in the register 18, and the corresponding words in the memory, are more or less precise measures of the phases of the incoming signal components with respect to the cycling of the counter 16.

This data can then be processed, as convenient, to provide OMEGA phase difference data, with one stage of lane identification, or the phase data can be combined to provide the difference, or a 3.4-kHz phase. Alternatively, the data can be processed to yield distance and deviation from a straight line track in an oblique linear coordinate system matching the hyperbolic grid of the Global Navigation Formula, etc.

Internal synchronization of the system of FIG. 1 is achieved in the following manner. The system switches between 10.2-kHz and 13.6-kHz tracking functions by setting the counter 12 to count by four for 10.2-kHz and three for 13.6-kHz; and by setting the counter 40 to count by nineteen to provide the 9.52-kHz L.O. signal for 10.2-kHz, and to count by fourteen for the L.O. signal at 12,920-Hz for heterodyning the 13.6-kHz.

Depending upon the count of the reset controls when they are activated or deactivated, the counters may restart at any random count, with a resulting phase increase in the reference and L.O. signal phases.

The basic time scale of the system is the output of the counter 60 at 680-Hz, which is a common factor of all four frequencies: 13.6-, 12.92-, 10.2- and 9.52-kHz. To ensure that the reference and L.O. signals are always in the proper phase, the output of counter 60 is applied to the reset counters 12, 16, 40, and 44. Thus, after each change in the state of the reset controls 14 and 42, a reset pulse is applied to reset the four counters to zero with the cycling of the counter 60. Since the period of the four counters is commensurate with the output of the counter 60, at both 10.2kHz and 13.6-kHz, the four counters will thereafter always be in step zero when a reset pulse is emitted by the counter 60. Thus no further resets occur until another frequency change is called, unless one of the counters miscounts.

In the OMEGA multiplex sequence of FIGS. 2(a), 2(b), and 2(c), when all eight stations are in operation, there will be both a 10.2kHz and a 13.6-kHz component from two of the stations in every segment of the commutating sequence. In the present embodiment of the receiver, there is only one phase sampler and one A/D converter for phase data, so that only one RF-phase can be tracked at a time. The sequence of transmissions to be tracked depends simply on the computer program, and can be set up in any sequence desired. In the unusual case where the transmissions of three selected stations to be tracked do not overlap, it is possible to track all six components in each 10-second multiplex period.

In the more usual case of overlapping transmissions, the computer program must be extended over two or three sequences to track all six components from three stations, and up to four sequences, to track all eight components from four stations. The above situation can be mitigated to some extent, by taking the average of the phase at both frequencies as the basic phase data, or by tracking one frequency from a particular station more frequently than the other, etc.

As part of the tracking process, the system of FIG. 1 provides a precise measure of the signal amplitudes, as well as phase, as an inherent part of the tracking process. The measure appears as digital quantities stored in the computer memory. This data can be used for the following purposes:

O — Indication of the presence or absence of a signal
O — Indication of loss of commutator synch
O — As a research tool, for tracking signal amplitudes
O — To provide a communications channel Due to the cancellation process, if a signal drops out, a large signal envelope output appears in that segment of the sequence due to the then uncancelled local signal, which could be used as a fault warning, or for conveying a message code.

Obviously many modifications and variations of the present invention are possible in the light of the above teaching. It is therefore to be understood that within the scope of the appended claims the invention may be practiced otherwise than as specifically described.

What is claimed is:

1. Tracking filter apparatus for determining the relative phase of synchronized CW navigation systems comprising:
   input terminal means for receiving remote signals whose phase is to be determined;
   first signal generating means for generating a sinusoidal signal having a phase and magnitude to that of the fundamental component of received signal;
   a difference circuit coupled to said input terminal and said first signal generating means and having an output that is proportional to the phasor difference of its inputs;
   phase register means coupled to said first signal generating means for providing a signal that has a value that causes the fundamental component of said signal generated by said first signal generating means to match the phase of the corresponding incoming signal component and is a measure of the phase difference of the incoming signal.

2. The apparatus of claim 1 and further including mixer means coupled to said difference circuit and local oscillator means coupled to said mixer means and to said first signal generating means for synchronizing the local oscillator signal with said fundamental component of the received signal.

3. The apparatus of claim 2 wherein detector means are coupled to said mixer means for detecting said received signal and sampling means coupled to said detector means for sampling said detected signal at a predetermined rate.

4. The apparatus of claim 1 wherein attenuator means is coupled between said first signal generating means and said difference circuit for attenuating said generated signal by means of a preselected computed signal.

5. The apparatus of claim 1 wherein said first signal generating means include:
   a clock pulse generator operating at a predetermined frequency which is a common multiple of the frequency of a signal to be processed;
   variable counter means coupled to said clock pulse generator for selectively providing output frequencies corresponding to frequencies of input signals to be processed;
   coincidence matrix means coupled to said variable counter means and to said phase register means for providing an output signal having a phase and magnitude to that of the fundamental component of the received signal.

6. Tracking filter apparatus for determining the relative phase of a sinusoidal or other periodic signal, comprising:
   input terminal means for receiving the signal whose phase is to be determined;
   first signal generating means for generating a local periodic signal having a phase and magnitude similar to that of the signal whose phase is to be determined;
   a difference circuit coupled to said input terminal and to said first signal generating means and having an output that is proportional to the phasor difference of its inputs;
   phase control means coupled to said first signal generating means and to said difference circuit for adjusting the phase of said local signal in response to the amplitude of the quadrature component of said phasor difference with respect to said local signal;

amplitude control means coupled to said first signal generating means and to said difference circuit for adjusting the amplitude of said local signal in response to the amplitude of the in-phase component of said phasor difference with respect to said local signal.

* * * * *